United States Patent
Wang et al.

(10) Patent No.: US 7,280,190 B1
(45) Date of Patent: Oct. 9, 2007

(54) ELECTRO-OPTIC TIME DOMAIN REFLECTOMETRY

(75) Inventors: Zhiyong Wang, Chandler, AZ (US); Rajendra Dias, Phoenix, AZ (US); Deepak Goyal, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/472,640

(22) Filed: Jun. 21, 2006

(51) Int. Cl.
*G01N 21/00* (2006.01)

(52) U.S. Cl. .................................... 356/73.1
(58) Field of Classification Search ............. None
See application file for complete search history.

(56) References Cited

U.S. PATENT DOCUMENTS

| | | |
|---|---|---|
| 4,603,293 A | 7/1986 | Mourou et al. |
| 5,321,632 A | 6/1994 | Otsuji et al. |
| 5,376,888 A | 12/1994 | Hook |
| 5,585,913 A | 12/1996 | Hariharan et al. |
| 5,726,578 A | 3/1998 | Hook |
| 6,104,200 A | 8/2000 | Hook |
| 6,524,871 B2 * | 2/2003 | Okawauchi .................. 438/16 |
| 6,542,228 B1 | 4/2003 | Hartog |
| 7,005,995 B2 | 2/2006 | Hornsby et al. |
| 2005/0270530 A1 * | 12/2005 | Wada et al. ................ 356/364 |

* cited by examiner

*Primary Examiner*—Tu T. Nguyen
(74) *Attorney, Agent, or Firm*—Schwabe, Williamson & Wyatt, P.C.

(57) ABSTRACT

Apparatuses, methods, and systems associated with and/or having components capable of, isolating defects in microelectronic packages are disclosed herein. In various embodiments, a defect-isolation apparatus may include an optoelectronic module to convert an optical test signal to an electrical test signal and provide the electrical test signal to a device under test; an electro-optic probe including an electro-optic crystal to polarize an optical sampling signal upon application of an electrical test signal reflected from the device under test to the electro-optic crystal; and an output module configured to receive the polarized optical sampling signal, and produce an electrical output signal as a function of time based at least in part on the polarized optical sampling signal, the electrical output signal adapted to facilitate isolation of the location(s) of the defect(s) in the device under test.

19 Claims, 2 Drawing Sheets

ELECTRO-OPTIC TIME DOMAIN REFLECTOMETRY

TECHNICAL FIELD

Embodiments of the invention relate generally to the field of quality and reliability control of microelectronic devices, specifically to methods, apparatuses, and systems associated with defect isolation and/or analysis.

BACKGROUND

In the field of microelectronic device manufacturing, devices may be subjected to a variety of testing to determine the existence of electrical defects. Although testing whether a device is "good" or "bad" is generally straightforward, difficulty lies in determining the location of any defects. Isolating the exact layer in which a defect is located may be important to determining the root cause of failures; e.g., failures may arise from problems in the manufacturing process, perhaps at a particular process stage, and/or equipment.

Currently, there are several methods for isolating defects. For example, time domain reflectometry has been used to isolate defects in a device. Time domain reflectometry is a method of transmitting an electrical pulse to a conductor. Defects (such as opens and shorts in a die or package) reflect the electrical pulse, and the reflected pulse is measured as a function of time. The reflected measurement is compared to a reference to determine the exact location of the defect. The problem with this method is that the electrical pulses have a relatively long rise time and thus the reflected waveform does not enable fine resolution of the location of a defect. This problem makes this method ineffective in identifying defects in complex packages and/or isolation if faults within layers or between a die and a package. Furthermore, this method usually involves destructive analysis by physically grinding away each layer of a device and testing after each layer is grinded away which may be time-consuming and clearly do not permit use of the device once destroyed.

Electro-optic sampling is a sampling method that has been enlisted to determine electric fields in various semiconductor devices. Electro-optic sampling can be considered a high-frequency sampling oscilloscope and thus has a benefit of being able to sample a device on a very short time interval. However, this method may not be able to determine an exact location of a defect in a device or in a device layer.

BRIEF DESCRIPTION OF THE DRAWINGS

Embodiments of the present invention will be readily understood by the following detailed description in conjunction with the accompanying drawings. Embodiments of the invention are illustrated by way of example and not by way of limitation in the figures of the accompanying drawings.

DETAILED DESCRIPTION OF EMBODIMENTS OF THE INVENTION

In the following detailed description, reference is made to the accompanying drawings which form a part hereof and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent.

The description may use perspective-based descriptions such as up/down, back/front, and top/bottom. Such descriptions are merely used to facilitate the discussion and are not intended to restrict the application of embodiments of the present invention.

The description may use the phrases "in an embodiment," or "in embodiments," which may each refer to one or more of the same or different embodiments. Furthermore, the terms "comprising," "including," "having," and the like, as used with respect to embodiments of the present invention, are synonymous.

The phrase "A/B" means "A or B." The phrase "A and/or B" means "(A), (B), or (A and B)." The phrase "at least one of A, B and C" means "(A), (B), (C), (A and B), (A and C), (B and C) or (A, B and C)." The phrase "(A) B" means "(B) or (A B)," that is, A is optional.

Figure 1:
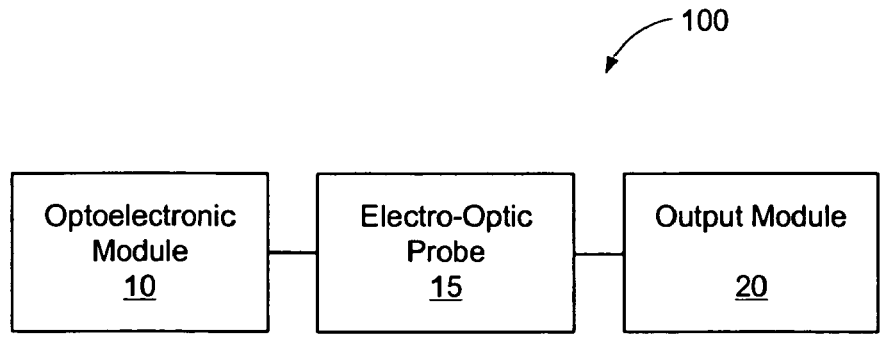
FIG. 1 illustrates a defect-isolation apparatus incorporated with the teachings of the present invention, in accordance with various embodiments.

Referring now to FIG. 1, illustrated is an embodiment of a defect-isolation apparatus 100 in accordance with various embodiments of the present invention. For the embodiments and as shown, defect-isolation apparatus 100 may comprise an optoelectronic module 10, which may provide an electrical signal to electro-optic probe 15. Electro-optic probe 15 may provide an electrical signal to a device under test (DUT) and if defect(s) are present in the DUT, an electrical signal may be reflected by such defect(s). In various embodiments, an optical sampling signal may also be provided to electro-optic probe 15, and a reflected electrical signal reflected from any defect(s) in a DUT may cause the optical sampling signal to be polarized by electro-optic probe 15. Output module 20 may be configured to receive a polarized optical sampling signal and produce an electrical output signal as a function of time based at least in part on the polarized optical sampling signal, the electrical output signal adapted to facilitate isolation of location(s) of any defect(s) in a DUT. The optical sampling signal allows for high-frequency sampling of the DUT, permitting the output module 20 to produce an electrical output signal having a temporal resolution of a location of a defect in a DUT on a scale of about 1 picosecond or less.

Optoelectronic module 10 may be variously configured. For example, optoelectronic module 10 may be configured to convert an optical signal to an electrical signal and/or an electrical signal to an optical signal. In various ones of these embodiments, optoelectronic module 10 may be configured to receive an optical test signal and convert the optical test signal to an electrical test signal, and may be configured to provide the electrical test signal to a DUT, as mentioned previously. In various embodiments, conversion of an optical signal to an electrical signal may be accomplished by a photoconductive switch.

Defect-isolation apparatus 100 may comprise, and optoelectronic module 10 may be configured to receive an optical signal from, any one or more of various optical sources. For example, an optical signal may be outputted from a laser source, and in various ones of these embodiments, a short-pulse laser (e.g., a 100-femtosecond pulsed laser) may be used. A laser source may be of a solid-state variety or may be a fiber-oscillator laser system. For the most part, a laser source may be any commercially-available laser source.

Figure 2:
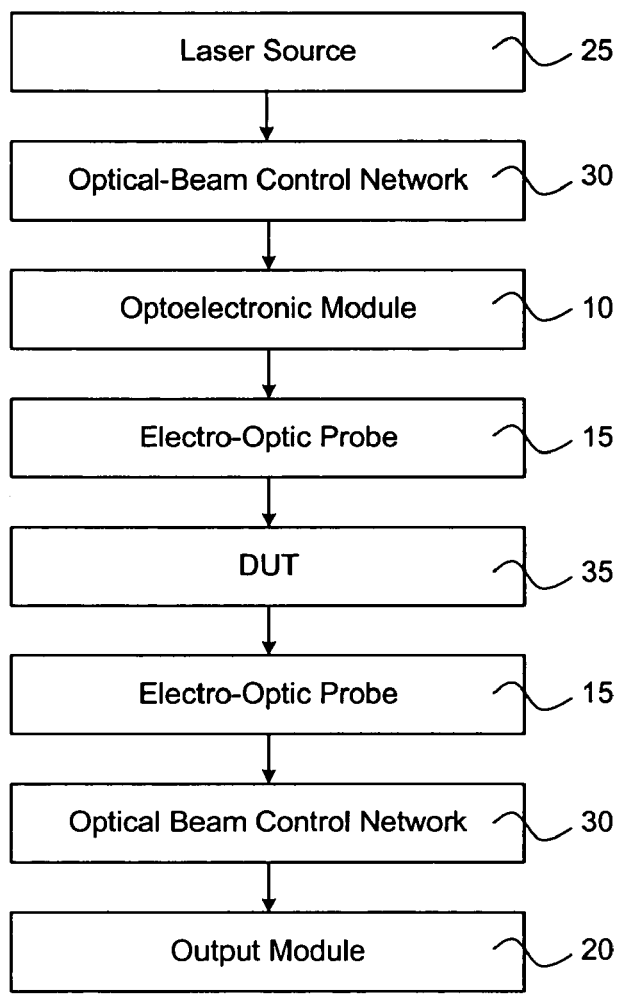
FIG. 2 illustrates components of a defect-isolation apparatus incorporated with the teachings of the present invention, in accordance with various embodiments.

In various embodiments, defect-isolation apparatus 100 may comprise an optical-beam control network 30, as shown in FIG. 2. An optical-beam control network 30 may be comprised of one or more of various optical elements to separate an optical signal into two or more optical signals including, for example, an optical test signal and an optical sampling signal. As mentioned previously, optoelectronic module 10 may be configured to receive an optical test signal and convert the optical test signal to an electrical test signal (to be provided to a DUT). In various embodiments and as discussed previously, an optical sampling signal may be polarized by an electro-optic probe 15, depending on the existence of any defect(s) in a DUT.

Defect-isolation apparatus 100 may comprise various optical elements depending on the applications. For example, in various embodiments, optical-beam control network 30 may be coupled to optoelectronic module 10. In various ones of these embodiments, optical-beam control network 30 may be coupled to optoelectronic module 10 by one or more optical fiber couplers. Optical element(s) of optical-beam control network 30 may comprise one or more of various commercially-available components including, for example, a Faraday isolator, a beam splitter, a stepper-motor delay stage with a corner-cube retro-reflector, an acousto-optic modulator, a waveplate, a polarizer, a polarization-dependent beam-splitting cube, a photodetector, and optical-fiber couplers.

Electro-optic probe 15 may include an electro-optic crystal. In various embodiments, if a DUT reflects an electrical signal due to a defect, the reflected electrical signal may cause an electro-optic crystal of electro-optic probe 15 to experience a change in polarization, i.e., an optical sampling signal provided to electro-optic probe 15 would be outputted with a different polarization than the inputted optical signal. The polarized optical sampling signal may then be outputted to output module 20 for analysis, as discussed more fully below.

In various embodiments, output module 20 may be configured to receive a polarized optical sampling signal and produce therefrom an electrical output signal as a function of time based at least in part on the polarized optical sampling signal. The electrical output signal may be adapted to facilitate isolation of location(s) of any defect(s) in a DUT. As shown in FIG. 2, a polarized optical sampling signal may pass first through optical-beam control network 30 and/or optoelectronic module 10, and in various ones of these embodiments, output module 20 may be coupled to optical-beam control network 30 by one or more optical fibers. However, in various other embodiments, output module 20 may be configured to receive a polarized optical sampling signal via electro-optic probe 15 directly or via some component other than optoelectronic module 10.

Output module 20 may comprise a photodetector and a lock-in amplifier. In various ones of these embodiments, a photodetector may be configured to receive a polarized optical signal and produce an electrical output signal therefrom. A lock-in amplifier may be coupled to a photodetector and may be configured to output the electrical output signal to a user interface for isolation of the location(s) of any defect(s) in a DUT. In various embodiments, output module 20 may be configured to then produce an electrical output signal having a temporal resolution on a scale of about 1 picosecond or less due to the high-frequency sampling of the DUT by the optical sampling signal.

Figure 3:
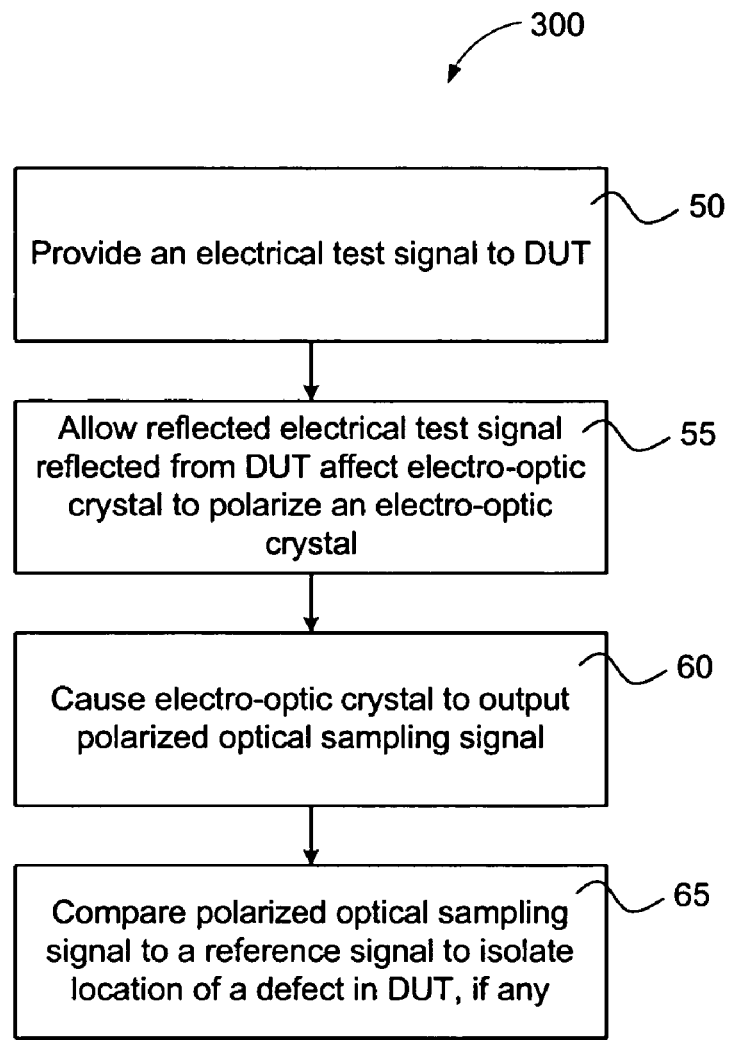
FIG. 3 illustrates a method for isolating defects in a device under test incorporated with the teachings of the present invention, in accordance with various embodiments.

Referring now to FIG. 2 and FIG. 3, illustrated is a general progression of an optical input signal beginning with a laser source 25 through output of a polarized optical sampling signal to an output module 20 (FIG. 2) and a method 300 in accordance with various embodiments of the present invention (FIG. 3). Reference to one or both of FIG. 2 and FIG. 3 may aid in the understanding of various embodiments of the present invention.

As shown in FIG. 2, a laser source 25 may provide an optical input signal to an optical-beam control network 30, which may separate the optical input signal into two or more optical signals (e.g., an optical test signal and an optical sampling signal). Optical-beam control network 30 may provide an optical test signal to an optoelectronic module 10 for conversion to an electrical test signal. An electrical test signal may then be provided to electro-optic probe 15 to provide to a DUT 35 (as shown in FIG. 3 at 50).

If any defect(s) are present in DUT 35, an electrical test signal may be reflected and any delay of reflection of electrical signals may be a function of its location in DUT 35 (i.e., defect "A" located closer to electro-optic probe 15 than defect "B" would provide a reflected electrical test signal to electro-optic probe 15 sooner than defect "B" would). Any reflected electrical test signal may cause electro-optic probe 15 to experience a change in polarization and said polarization change may cause an optical sampling signal to be polarized accordingly (as shown in FIG. 3 at 50, 55). As mentioned previously, the polarization change may be accomplished using an electro-optic crystal of the electro-optic probe 15. A polarized optical sampling signal may be output to an output module 20 via electro-optic probe 15 and optical-beam control network 30, and as mentioned previously, output module 20 may output an electrical output signal adapted to facilitate isolation of the location(s) of defect(s) in a DUT 35. Although the shown embodiment illustrates a polarized optical sampling signal outputted to an output module 20 via electro-optic probe 15 and optical-beam control network 30, in various other embodiments a polarized optical sampling signal may be outputted to an output module 20 directly or via other components, depending on the applications.

In various embodiments, location(s) of defect(s) in a DUT 35 may be determined by comparing a polarized optical sampling signal to a reference signal (as shown in FIG. 3 at 65). In various ones of these embodiments, a reference signal may be a signal waveform from a "known-good unit," i.e., a device having no or few defects. As mentioned previously, in various embodiments, an electrical output signal may have a temporal resolution on a scale of about 1 picosecond or less. Thus, a defect in DUT 35 may be located with a high degree of accuracy. Furthermore, in various embodiments, an optical sampling signal and a polarized optical sampling signal (later converted to an electrical output signal) may be synchronized which may further enhance the accuracy of isolating location(s) of defect(s) in DUT 35.

In various embodiments, an electrical output signal may be output to a user interface (not shown). In some of these embodiments, a user interface may be a standard personal computer. A user interface may be endowed with one or more software programs, e.g., a data-acquisition software program, to acquire and/or save acquired data.

Figure 4:
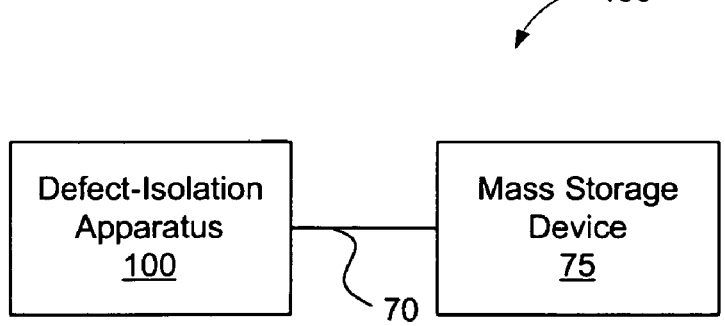
FIG. 4 illustrates a system for isolating defects in a device under test incorporated with the teachings of the present invention, in accordance with various embodiments.

Referring now to FIG. 4, illustrated is a system 400 in accordance with various embodiments of the present invention. As shown, system 200 may comprise a defect-isolation apparatus 100, a bus 70 coupled to the defect-isolation apparatus 100, and a mass storage device 75 coupled to the bus 70. Mass storage device 75 may be adapted to store defect-analysis data and/or various other data. Examples of the mass storage device include, but are not limited to, a hard disk drive, a compact disk (CD) drive, a digital versatile disk (DVD) drive, a floppy diskette, a tape system, and so forth. System 400 may comprise a user interface coupled to the defect-isolation apparatus to display data, including, for example, an electrical output signal.

In various embodiments, system 200 may be a fully integrated unit or may comprise a number of separate components that may be coupled or otherwise associated with each other. Furthermore, in embodiments endowed with a user interface, the user interface may comprise any one or more various software programs to aid in one or more of data acquisition, data storage, device handler operation and/or control, and/or other various functions.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments shown and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. An apparatus for facilitating isolation of defects in a device under test (DUT) comprising:
    an optoelectronic module configured to convert an optical test signal to an electrical test signal and provide the electrical test signal to the DUT to be reflected by one or more defects located in the DUT if the one or more defects are present in the DUT;
    an electro-optic probe including an electro-optic crystal to output a polarized optical sampling signal, the polarization being dependent upon the electrical test signal reflected from the DUT to the electro-optic crystal; and
    an output module configured to receive the polarized optical sampling signal, and produce an electrical output signal as a function of time based at least in part on the polarized optical sampling signal, the electrical output signal adapted to facilitate isolation of the location(s) of the defect(s) in the DUT.

2. The apparatus of claim 1, wherein the optoelectronic module includes a photoconductive switch to convert the first optical test signal to the electrical test signal.

3. The apparatus of claim 1, further comprising an optical-beam control network coupled to the optoelectronic module and configured to split an optical input signal into an optical test signal and an optical sampling signal.

4. The apparatus of claim 3, wherein the optical-beam control network is coupled to the optoelectronic module by one or more optical fiber couplers.

5. The apparatus of claim 3, wherein the optical-beam control network is configured to split a short-pulse laser beam into an optical test signal and an optical sampling signal.

6. The apparatus of claim 1, wherein the optoelectronic module is configured to convert a short-pulse laser beam to an electrical test signal.

7. The apparatus of claim 1, wherein the output module comprises a photodetector configured to receive a polarized optical signal and produce an electrical output signal therefrom.

8. The apparatus of claim 7, wherein the output module further comprises a lock-in amplifier to output the electrical output signal to a user interface.

9. The apparatus of claim 1, wherein the output module is configured to produce an electrical output signal having a temporal resolution on a scale of about 1 picosecond or less.

10. A method for facilitating isolation of defects in a device under test (DUT) comprising:
    providing an electrical test signal to a DUT to be reflected by one or more defects in the DUT, if present;
    allowing the reflected electrical test signal from the DUT to effect an electro-optic crystal to polarize the electro-optic crystal;
    causing the electro-optic crystal to output a polarized optical sampling signal;
    comparing the polarized optical sampling signal to a reference signal to isolate a location of a defect in the DUT, if present;
    producing an electrical output signal as a function of time based at least in part on the polarized optical sampling signal; and
    outputting the electrical output signal to isolate a location of a defect in the DUT, if present.

11. The method of claim 10, further comprising separating an optical input signal into an optical test signal and an optical sampling signal.

12. The method of claim 11, further comprising converting the optical test signal to an electrical test signal to provide to the DUT.

13. The method of claim 11, further comprising synchronizing the optical sampling signal and the polarized optical sampling signal.

14. The method of claim 10, wherein said providing the optical sampling signal to the electro-optic crystal to output the polarized optical signal comprises providing an optical sampling signal to the electro-optic crystal to output a polarized optical signal having a rise time of about 1 picosecond or less.

15. The method of claim 10, wherein said comparing the polarized optical signal to the reference signal to determine the location of a defect in the DUT comprises:
    producing an electrical output signal based on the polarized optical signal; and
    comparing the electrical output signal to a reference signal to determine a location of a defect in the DUT.

16. The method of claim 15, further comprising outputting the electrical output signal to a user interface.

17. A system comprising:
    a defect-isolation apparatus, including:
        an optoelectronic module configured to convert an optical test signal to an electrical test signal and provide the electrical test signal to a device under test (DUT) to be reflected by one or more defects located in the DUT if the one or more defects are present in the DUT;

an electro-optic probe including an electro-optic crystal to output a polarized optical sampling signal, the polarization being dependent upon the electrical test signal reflected from the DUT to the electro-optic crystal; and an output module configured to receive the polarized optical sampling signal, and produce an electrical output signal as a function of time based at least in part on the polarized optical sampling signal, the electrical output signal adapted to facilitate isolation of the location(s) of the defect(s) in the DUT; and a bus coupled to the apparatus; and a mass storage device coupled to the bus.

18. The system of claim 17, wherein the output module comprises a photodetector and a lock-in amplifier.

19. The system of claim 17, further comprising a user interface coupled to the defect-isolation apparatus to display the electrical output signal.

* * * * *